United States Patent [19]

Das

[11] Patent Number: 5,617,104

[45] Date of Patent: Apr. 1, 1997

[54] HIGH TC SUPERCONDUCTING TUNABLE FERROELECTRIC TRANSMITTING SYSTEM

[76] Inventor: Satyendranath Das, P.O. Box 574, Mt. View, Calif. 94042-0574

[21] Appl. No.: 616,337

[22] Filed: Mar. 15, 1996

Related U.S. Application Data

[63] Continuation of Ser. No. 39,575, May 31, 1995, and Ser. No. 36,827, Mar. 28, 1995.

[51] Int. Cl.⁶ .................. H01Q 1/38; H03B 5/18
[52] U.S. Cl. .................. 343/700 MS; 343/787; 331/99; 331/107 SL; 331/117 FE; 333/99 S
[58] Field of Search ............ 343/700 MS, 787, 343/864; 331/99, 107 SL, 117 FE; 333/35, 158, 99 S

[56] References Cited

U.S. PATENT DOCUMENTS

| | | | |
|---|---|---|---|
| 3,778,717 | 12/1973 | Okoshi et al. | 343/700 MS |
| 4,331,940 | 5/1982 | Uwano | 331/99 |
| 4,673,895 | 6/1987 | Tadachi et al. | 331/117 FE |
| 4,982,168 | 1/1991 | Sigmon et al. | 331/107 SL |
| 5,248,947 | 9/1993 | Shiga | 343/700 MS |
| 5,309,119 | 5/1994 | Shiga | 331/99 |

Primary Examiner—Donald T. Hajec
Assistant Examiner—Tan Ho

[57] ABSTRACT

Three embodiments of a tunable ferroelectric transmitting system are included. Each embodiment includes a tunable oscillator and a tunable antenna. Two embodiments include a negative resistance diode, the frequency of oscillation being controlled by a single crystal tunable ferroelectric resonator. The third embodiment uses a transistor. The tunable antenna is made of a single crystal tunable ferroeletric resonator. All conducting depositions are made of films of a high Tc superconducting material.

1 Claim, 15 Drawing Sheets

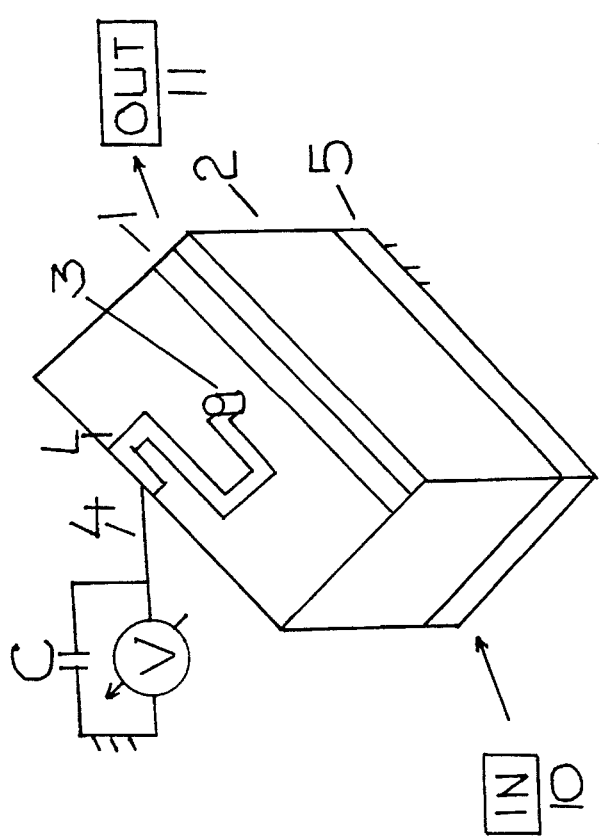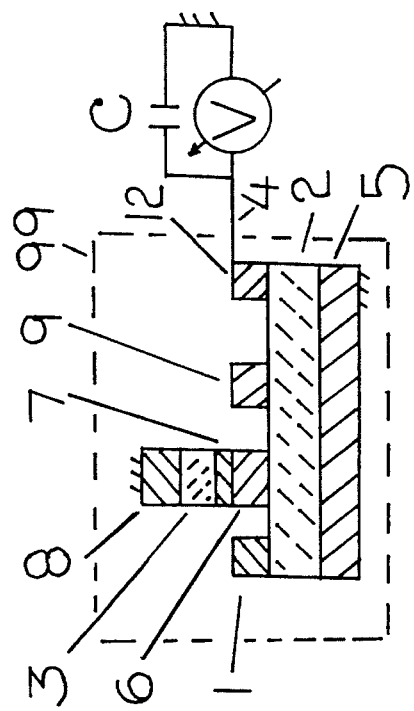

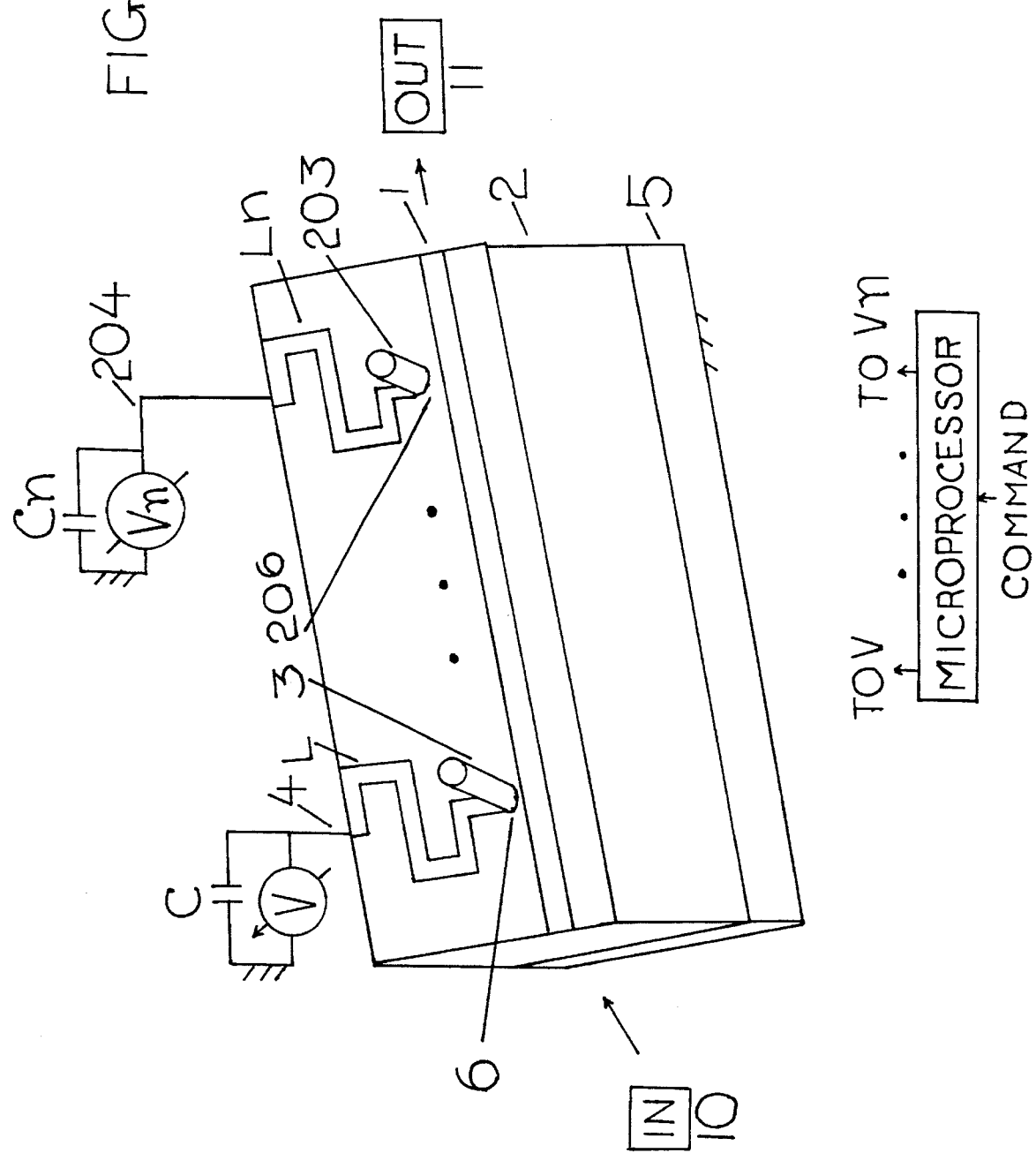

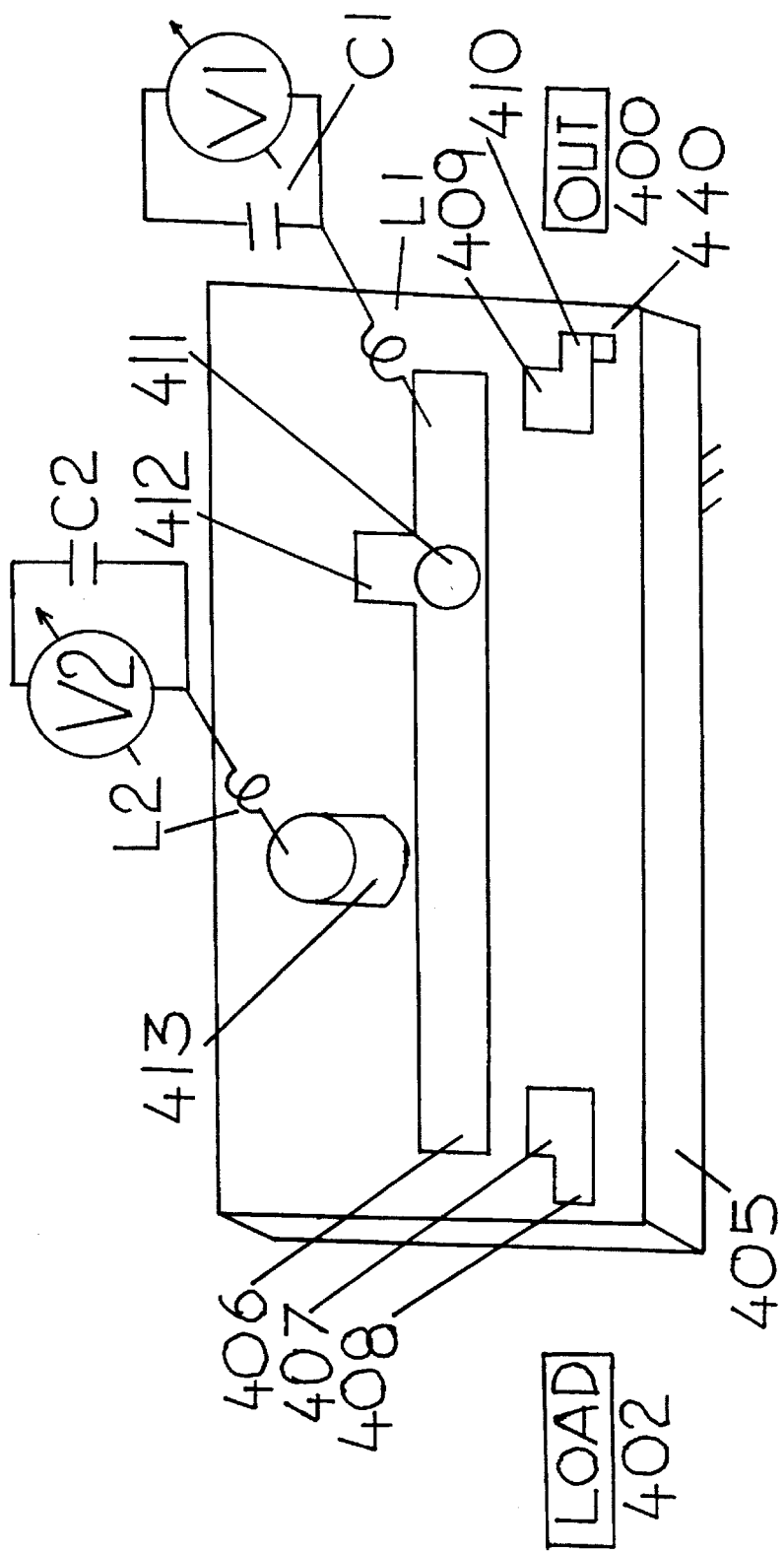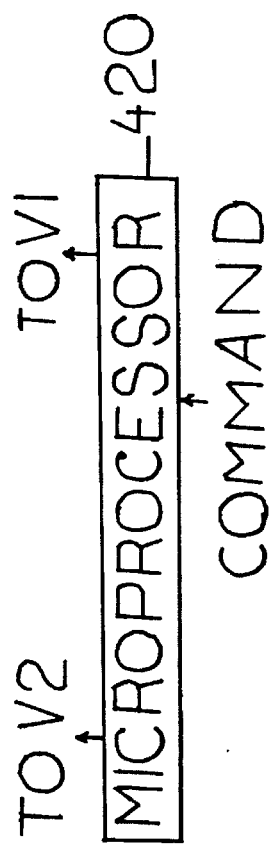
FIG. 14

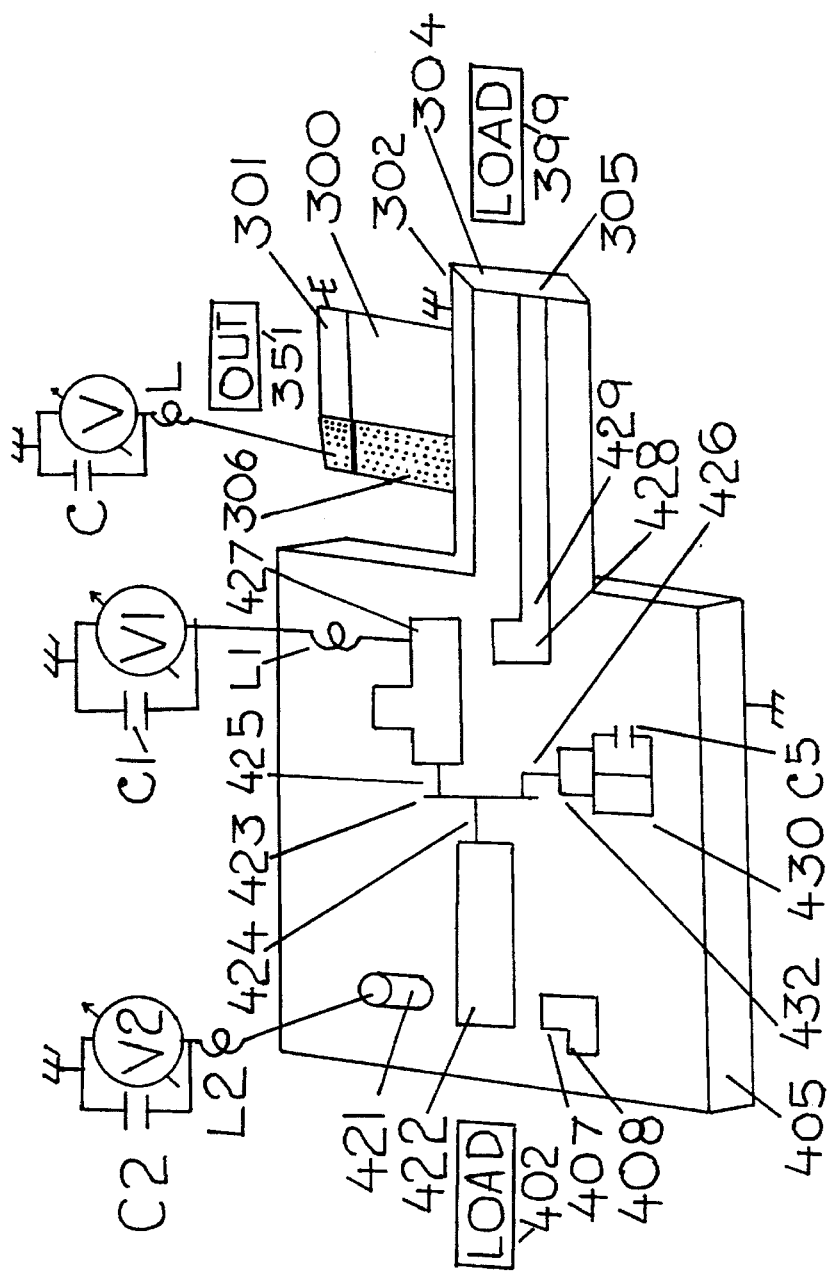
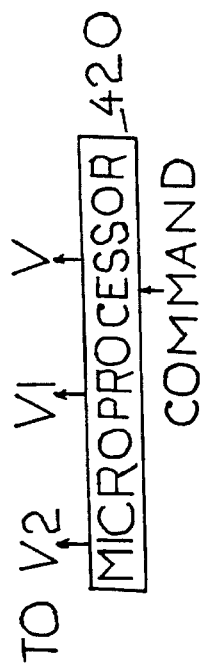
FIG. 21

HIGH TC SUPERCONDUCTING TUNABLE FERROELECTRIC TRANSMITTING SYSTEM

This application is a continuation of applications 29/039,575 filed on May 31, 1995 and 29/036,827 filed on Mar. 28, 1995, both are pending.

FIELD OF INVENTION

This invention relates to filters and transmitting systems for electromagnetic waves, more particularly to RF filters and transmitting systems, whose frequency can be tuned electronically.

DESCRIPTION OF PRIOR ART

In some electronic systems, it is often necessary to electronically change the frequency of a filter and a transmitting system, Commercial YIG tuned and varactor tuned oscillators are available. Commercial dielectric fixed tuned resonator oscillators and antennas are available.

Ferroelectric materials have a number of attractive properties. Ferroelectrics can handle high peak power. The average power handling capacity is governed by the dielectric loss of the material. They have a low switching time (such as 100 nS). Some ferroelectrics have low losses. The permittivity of ferroelectrics is generally large, as such the device is small in size. The ferroelectrics are operated in the paraelectric phase i.e. slightly above the Curie temperature to avoid hysterisis and to provide a maximum change in permittivity on the application of a bias voltage. Part of the tunable ferroelectric transmitting system and filters can be made of thin films, and can be integrated with other monolithic microwave/RF devices. Inherently, they have a broad bandwidth. They have no low frequency limitation as in the case of ferrite devices. The high frequency operation is governed by the relaxation frequency, such as 95 GHz for strontium titanate, of the ferroelectric material. The loss of the tunable ferroelectric transmitting system is low with ferroelectric materials with a low loss tangent. A number of ferroelectric materials are not subject to burnout. Ferroelectric filters are reciprocal devices.

SUMMARY OF INVENTION

Embodiments of tunable band reject and band pass filters are included. A microstrip line is deposited on a single crystal dielectric, such as sapphire, lanthanum aluminate, substrate. A single crystal tunable ferroelectric resonator is coupled to the transmission line and provides a band reject characteristics at a resonant frequency of the tunable resonator. A bias voltage applied to the resonator changes its resonant frequency and the band reject frequency of the tunable filter.

Another embodiment contains a tunable band reject filter with multiple band reject frequency bands provided by multiple tunable resonators.

Another embodiment contains a two section tunable band pass filter made of two single crystal ferroelectric resonators connected by a transmission line. An applied bias voltage changes the resonant frequency of the tunable band pass filter.

Another embodiment contains a four section tunable band pass filter made of single crystal tunable ferroelectric resonators connected by transmission lines.

Three embodiments of a tunable transmitting system are included. A tunable transmitting system contains a tunable oscillator and a tunable antenna. Two embodiments include a negative resistance diode. A third embodiment includes a transistor.

Each embodiment consists of a main microstrip line on a single crystal dielectric, such as sapphire, lanthanum aluminate, substrate. In one embodiment, a negative resistance diode, such as GUNN, TRAPATT, IMPATT, is mounted across the main microstrip line. A quarterwave, at a second harmonic of an operating frequency of the tunable transmitting system, open circuit microstrip line is connected near the diode to eliminate even harmonic operation. A bias is applied to the negative resistance diode to obtain a negative resistance characteristics. A single crystal tunable ferroelectric resonator is coupled to the main microstrip transmission line at an appropriate distance from the negative resistance diode for controlling the frequency of operation of the tunable oscillator. A bias voltage is applied to the single crystal tunable ferroelectric resonator for tuning its resonant frequency. A quadrature filter each is connected at the input and at the output end of the oscillator. The output of the oscillator is fed to a microstrip line of a tunable antenna. The opposite side of the substrate is deposited with a film of a conductor, which is grounded, on top of which is mounted a single crystal tunable ferroelectric resonator antenna. The input energy from the microstrip line is coupled to the antenna through a hole on the conductive film underneath the tunable antenna. A bias is applied to the antenna to change its radiated frequency.

In another embodiment of the transmitting system, the quarter wave open circuited microstrip transmission line is removed. In its place, a tunable ferroelectric resonator, tuned to a second harmonic of an operating frequency of the oscillator, is used to prevent even harmonic operation.

In another embodiment of the transmitting system, a transistor is used. A main microstrip line, discussed in previous embodiments, is connected to the gate. The drain is connected to a microstrip line matching network. The source is connected to a feedback loop. The design of the three embodiments are otherwise very similar.

Conducting depositions of each embodiment are made of films of a high Tc superconducting material such as YBCO, TBCCO. Each embodiment is operated at a high Tc superconducting temperature slightly above the Curie temperature of the ferroelectric material to avoid hysteresis and to obtain a maximum change in the permittivity. The quality of the single crystal high Tc superconductor is extremely high and provides a very high quality factor (Q) and a power handling capability of 0.5 MW.

With these and other objectives in view, as will hereinafter more fully appear, and which will be more particularly pointed out in the appended claims, reference is now made to the following description taken in connection with accompanying diagrams.

BRIEF DESCRIPTION OF THE DRAWINGS

FIG. 1 depicts a pictorial diagram of a high Tc superconducting band reject tunable ferroelectric resonator (TFR) filter.

FIG. 2 depicts a transverse cross-section of the tunable band reject filter of FIG. 1 through the single crystal ferroelectric.

FIG. 3 depicts a pictorial view of a high Tc superconducting band reject tunable ferroelectric filter with multiple ferroelectric resonators.

FIG. 14 depicts a pictorial view of a high Tc superconducting tunable ferroelectric resonator (TFR) first oscillator.

FIG. 21 depicts a pictorial view of a high Tc superconducting tunable ferroelectric resonator third transmitting system.

DETAILED DESCRIPTION OF THE EMBODIMENTS

Figure 4:
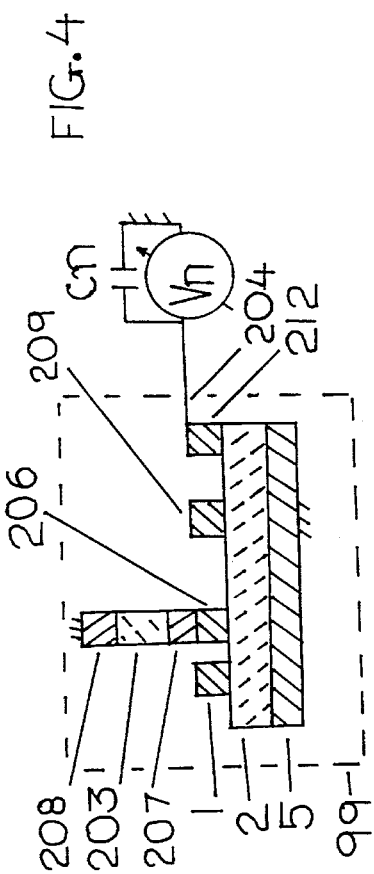
FIG. 4 depicts a transverse cross-section of FIG. 3 through a ferroelectric resonator.

FIG. 1 depicts a pictorial diagram of one embodiment of my invention, a high Tc superconducting tunable band reject ferroelectric resonator filter. The microstrip line 1 is comprised of a film of a single crystal high Tc superconductor such as YBCO, TBCCO. Use of a high quality single crystal high Tc superconductor material provides a very high Q and a power handling capability of 0.5 MW. The substrate 2 is a single crystal dielectric such as sapphire, lanthanum aluminate. The ferroelectric resonator is 3. The biasing wire is 4. The inductance L presents a high impedance, at an operating frequency of the tunable band reject filter, to RF energy. The capacitance C by passes to ground any RF energy present on the bias wire 4, A film of a single crystal high Tc superconductor 5 is deposited on the bottom side of the substrate 2 and is connected to ground. The dielectric resonator is tuned to $TE_{01}$ mode. The magnitude of the coupling between the ferroelectric resonator 3 and the microstrip line 1 is a function of the proximity of the ferroelectric resonator 3 and the microstrip line 1, dielectric constant of the ferroelectric resonator 3, dielectric constant of the substrate 2, presence of ground plane, cover. At a resonant frequency of the ferroelectric resonator, it places a short circuit on the microstrip line 1 resulting in a rejection of signal at that frequency. The application of a bias voltage changes the permittivity of the single crystal ferroelectric material, such as $KTa_{1-x}Nb_xO_3$, $Sr_{1-x}Pb_xTiO_3$, changing the resonant frequency of the ferroelectric resonator 3 and the rejection frequency of the tunable filter. If the permittivity of the single crystal ferroelectric material is changed from 5000 to 2500, then the resonant frequency of the ferroelectric resonator 3 could change approximately by a factor of 1.4:1. Increasing the coupling between the ferroelectric resonator 3 and the microstrip line 1 increases the tuning range of the band reject filter. The band reject filter is operated at a high Tc superconducting temperature slightly above the Curie temperature of the single crystal ferroelectric material of the resonator 3.

FIG. 2 depicts a transverse cross-section of the tunable band reject filter through the single crystal ferroelectric resonator 3. The microstrip line is 1. The single crystal dielectric substrate is 2. The bias conductor is 6. On top of the bias conductor 6 the single crystal ferroelectric resonator 3 is placed. The conducting deposition on the bottom and top sides of the single crystal ferroelectric resonator 3 are 7 and 8 respectively. The conducting deposition 8 is connected to ground as a return circuit for the application of the bias voltage. The cross-sections of the inductance L are 9 and 12. The bias wire is 4. The bias voltage is V. Below the substrate 2 is deposited a film of a single crystal high Tc superconductor 5 which is connected to ground. The TFR band reject filter is operated at a high Tc superconducting temperature. A commercial means, for operating the TFR band reject filter, is 99.

FIG. 3 depicts a pictorial view of another embodiment of my invention, a high Tc superconducting tunable band reject filter with multiple resonators comprised of a single crystal ferroelectric material. A tunable resonator 3 is coupled to a microstrip line 1 and provides a short circuit, on the microstrip line 1, at a resonant frequency of the ferroelectric resonator 3 tuned to the $TE_{01}$ mode. There is no effect on the microstrip line at a frequency out of resonance of the ferroelectric resonator. A variable bias voltage is connected through an LC filter to the ferroelectric resonator 3. The biasing conductor is 6. The biasing wire is 4. Application of a bias voltage changes the permittivity of the single crystal ferroelectric resonator 3 and the reject frequency of the filter. A second resonator 203, comprised of the same single crystal ferroelectric material, is depicted in FIG. 3 and is tuned to the same or a different frequency from that of the first resonator 3 depending on filter requirements. To eliminate or reduce the interferences at different frequencies, single crystal ferroelectric resonators, tuned to different frequencies, are used. A variable bias voltage is connected through an LnCn filter to the ferroelectric resonator 203. The biasing conductor is 206. The biasing wire is 204. Application of a bias voltage changes the permittivity of the single crystal ferroelectric resonator 203 and the reject frequency of the filter. Only two resonators are shown in FIG. 3, but, in practice, n resonators are used depending on the filter requirements. The separation distances between the centers of adjacent resonators are typically three quarters of a wavelength, at an operating frequency of the filter, or a value depending on the requirements of the filter. The bias voltages, and thus the reject frequencies of the individual resonators, are independently controlled by a microprocessor. The conductor of the microstrip line is comprised of a film of a single crystal high Tc superconductor, such as YBCO, TBCCO. The substrate 2 is a single crystal dielectric such as sapphire, lanthanum aluminate. The ferroelectric tunable filter is operated at a high Tc superconducting temperature slightly above the Curie temperature of the single crystal ferroelectric material such as $KTa_{1-x}Nb_xTiO_3$. The ferroelectric tunable resonator filter is a reciprocal device.

FIG. 4 depicts a transverse cross-section of FIG. 3 through the ferroelectric resonator 203. The microstrip line is 1. The single crystal dielectric substrate is 2. The bias conductor is 206. On top of the bias conductor 206 the single crystal ferroelectric resonator 203 is placed. The conducting deposition on the bottom and top sides of the single crystal ferroelectric resonator 203 are 207 and 208 respectively. The conducting deposition 208 is connected to ground as a return circuit for the application of the bias voltage. The cross-sections of the inductance Ln are 209 and 212. The bias wire is 204. The bias voltage is Vn. Below the substrate 2 is deposited a film of a single crystal high Tc superconductor 5 which is connected to ground. The TFR band reject filter is operated at a high Tc superconducting temperature slightly above the Curie temperature of the TFR 203. A commercial means, for operating the TFR band reject filter at a high Tc superconducting temperature, is 99.

Figure 5:
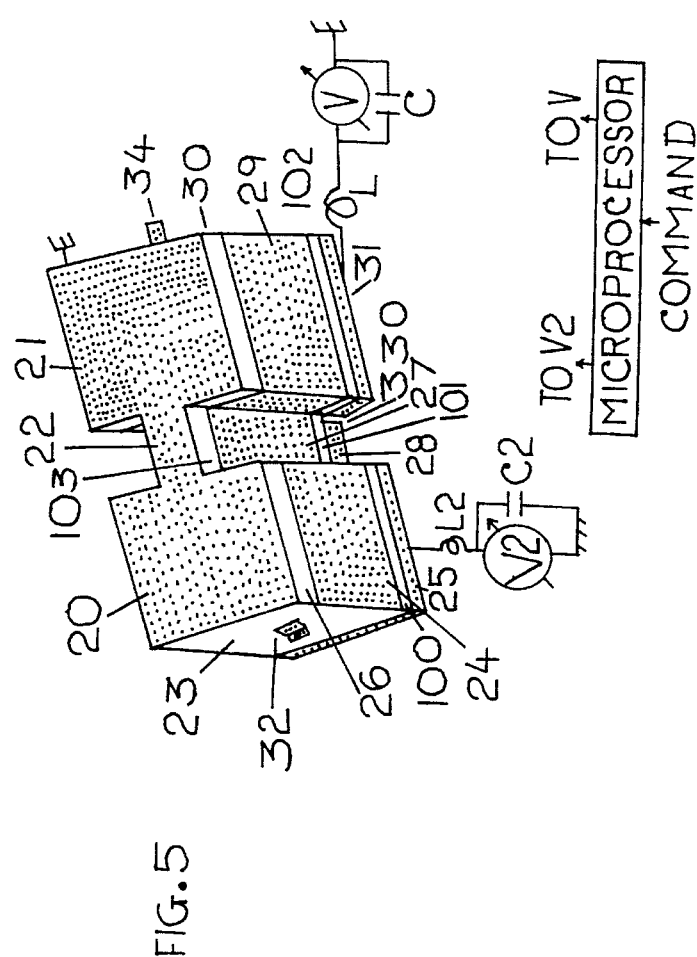
FIG. 5 depicts a pictorial view of a band pass tunable ferroelectric resonator (TFR) filter.

FIG. 5 depicts a pictorial view of another embodiment of my invention, a tunable band pass ferroelectric resonator filter. Two sections of band pass filter are depicted in FIG. 5. Each resonator is rectangular in shape and is resonant at a $TE_{10}$ mode frequency. The top side 20 of the first section of the filter is a quarter wave, at an operating frequency of the filter, long. The top surface 20 is metallized. The top side 21 of the second section of the filter is a quarter wave, at an operating frequency of the filter, long. The top surface 21 is metallized. The two sections of filter 20 and 21 are connected together by a narrow section 22. The top surface of the narrow section 22 is metallized. Below the metallized sections 20, 21 and 22 is a single crystal ferroelectric material such as $KTa_{1-x}Nb_xO_3$, $Sr_{1-x}Pb_xTiO_3$. The front surface of the first section of the filter is 23 which is not metallized. The rear surface of the first section of the filter is metallized. The front side surface 24 of the first section of the band pass filter is metallized. There is an unmetallized area each 26 and 100 at the top and bottom respectively of the metallized portion 24. The front side surface 29 of the second section of the band pass filter is metallized. There is an unmetallized area each 30 and 102 at the top and bottom respectively of the metallized portion 29. The front side surface 27 of the narrow section 22 is metallized. There is an unmetallized area each 103 and 101 at the top and bottom respectively of the metallized portion 27. The bottom surfaces of the filter sections and the narrow section connecting them are metallized. These metallic portions are 25, 31 and 28 respectively. There is an unmetallized area 330 between 28 and 31. The input is fed made at 32. The output is taken from 34. A bias voltage source is connected to 31. The inductance L provides a high impedance, at an operating frequency of the band pass filter, to the RF energy. Any remaining RF energy is by passed to the ground by the capacitor C. The top surface 21 is grounded to provide a return circuit to the bias voltage. A variable bias voltage V is applied to the ferroelectric material of the second section of the filter. With the application of a bias voltage, the permittivity of the ferroelectric material of the second section of the filter changes, changing the resonant frequency of the second resonator and the frequency of the signal passing through the band pass filter. A variable bias voltage V2 is applied to the first section of the filter, through an L2C2 filter, to change the frequency of the first section of the filter. Separate bias sources are depicted to provide a flexibility to obtain the same frequency of the two sections in the presence of manufacturing tolerances.

Figure 6:
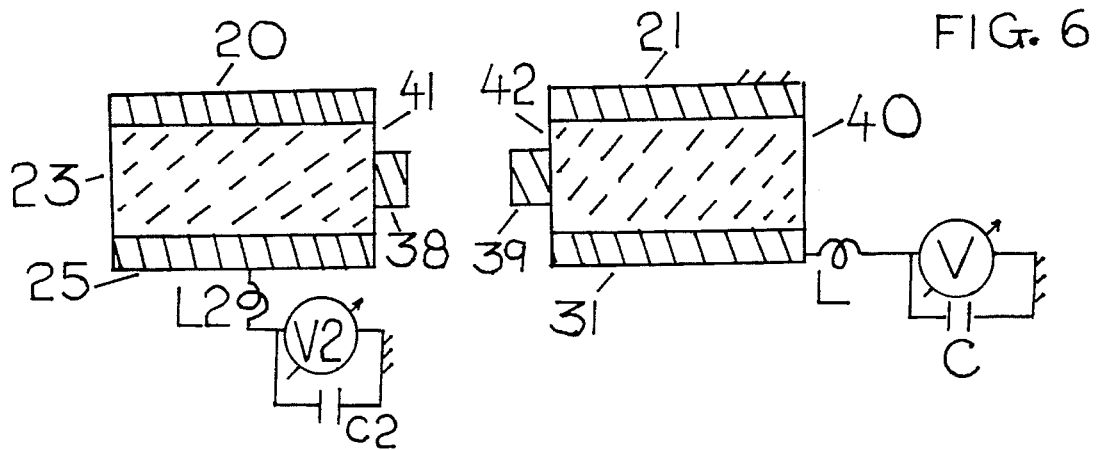
FIG. 6 depicts a longitudinal cross-section near the front end of the filter shown in FIG. 5.

FIG. 6 depicts a longitudinal cross-section near the front end of the filter shown in FIG. 5, without the narrow section connecting the two sections of the filter. The top metallized portion of the first section of the filter is 20. The front and the rear surfaces of the first section of the filter are 23 and 41 respectively. The metallized portion, on the bottom of the first section of the filter, is 25. The rear metallized portion, of the first section of the filter, is 38. There are unmetallized areas between 38 and 20, and between 38 and 25. The top metallized portion of the second section of the filter is 21. The front and the rear surfaces of the second section of the filter are 42 and 40 respectively. The metallized portion, on the bottom of the second section of the filter, is 31. The front metallized portion, of the second section of the filter, is 39. There are unmetallized areas between 39 and 21, and between 39 and 31. A variable voltage bias source V is connected to 31 through an inductance L. The inductance L provides a high Impedance at an operating frequency of the filter, to the RF energy. Any RF energy remaining after the inductance L is by passed to ground by the capacitor C. The top metallic portion 21 is connected to ground to provide a return circuit for the bias voltage. A variable bias source V2 is connected, through an L2C2 filter, to 25.

Figure 7:
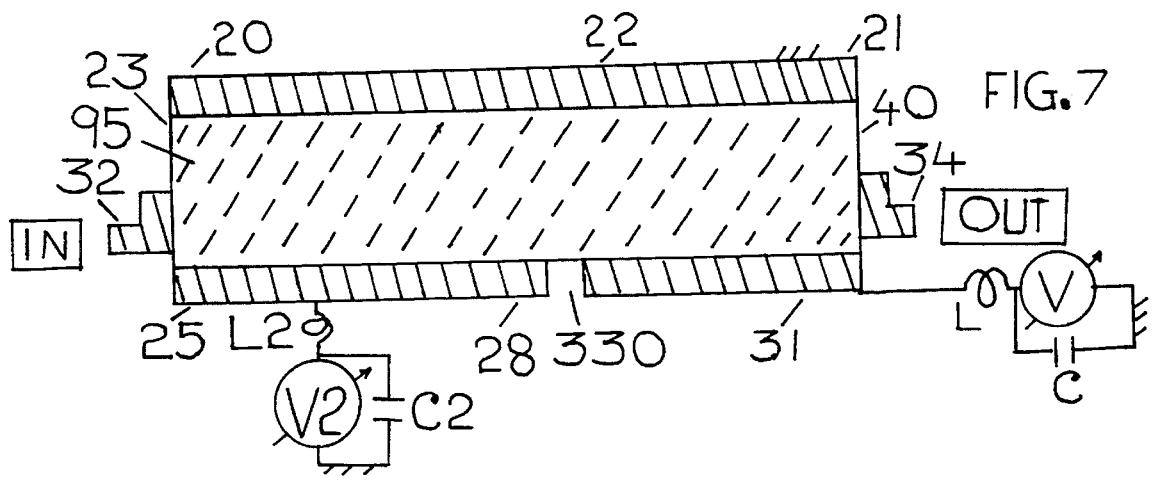
FIG. 7 depicts a longitudinal cross-section of the filter through the middle of FIG. 5.

FIG. 7 depicts a longitudinal cross-section of the filter through the middle of FIG. 5. The top metallized portion is 20, 22, and 21. The bottom metallized portion is 25, 28 and 31. An unmetallized area, on the bottom side of the filter, is 330. The front and rear surfaces of the filter are 23 and 40 respectively. The single crystal ferroelectric material is 95. The input is fed at 32. The output is taken from 34. A bias voltage is connected to 31 through an LC filter. A bias voltage V2 is connected to 25 through an L2C2 filter.

Figure 8:
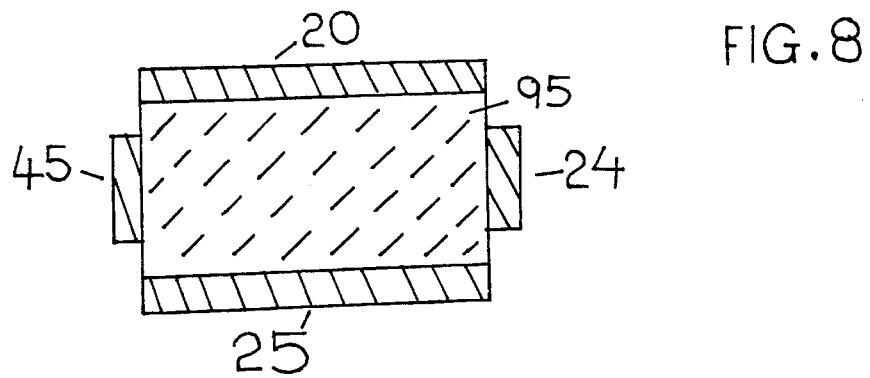
FIG. 8 is a transverse cross-section of the tunable first ferroelectric filter section depicted in FIG. 5.

FIG. 8 is a transverse cross-section of the tunable first ferroelectric filter section depicted in FIG. 5. The top metallized portion is 20. The bottom metallized portion is 25. The rear side metallized surface is 45 with each an unmetallized area between 45 and 25, and 45 and 20. The front side surface metallized area is 24 with each an unmetallized area between 24 and 25 and between 24 and 20 respectively. The single crystal ferroelectric material, such as $KTa_{1-x}Nb_xO_3$, $Sr_{1-x}Pb_xTiO_3$, is 95.

Figure 9:
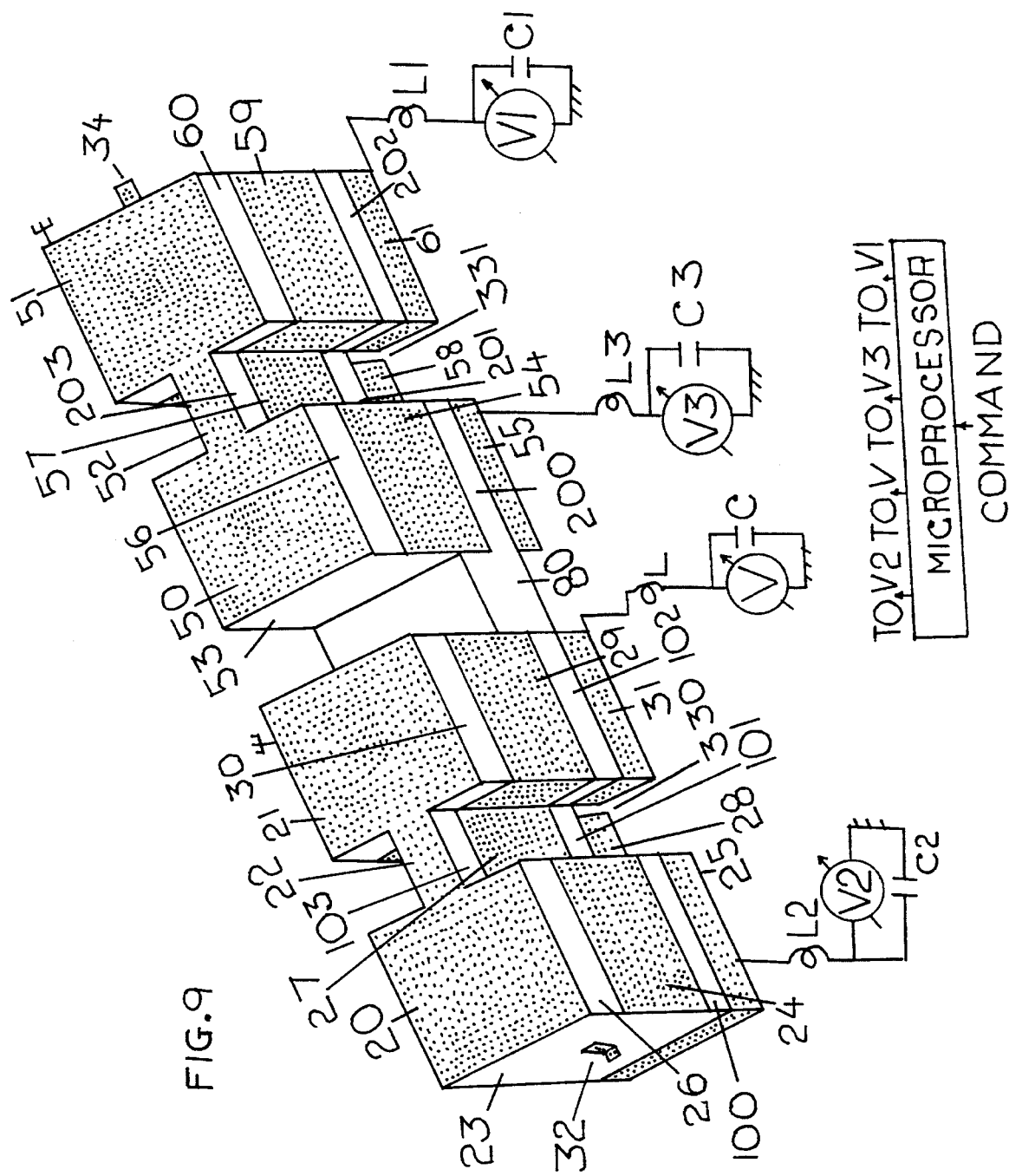
FIG. 9 depicts a pictorial view of a four section band pass tunable ferroelectric resonator (TFR) filter.

FIG. 9 depicts a pictorial view of another embodiment of my invention, a four section band pass tunable ferroelectric resonator (TFR) filter. Four sections of band pass filter are depicted in FIG. 9. Each resonator is rectangular in shape and is resonant at a $TE_{10}$ mode frequency. The top side 20 of the first section of the filter is a quarter wave, at an operating frequency of the filter, long. The top surface 20 is metallized. The top side 21 of the second section of the filter is a quarter wave, at an operating frequency of the filter, long. The top surface 21 is metallized. The two sections of filter 20 and 21 are connected together by a narrow section 22. The top surface of the narrow section 22 is metallized. Below the metallized sections 20, 21 and 22 is a single crystal ferroelectric material such as $KTa_{1-x}Nb_xO_3$, $Sr_{1-x}Pb_xTiO_3$. The front surface of the first section of the filter is 23 which is not metallized. The front side surface 24 of the first section of the band pass filter is metallized. There is an unmetallized area each 26 and 100 at the top and bottom respectively of the metallized portion 24. The front side surface 29 of the second section of the band pass filter is metallized. There is an unmetallized area each 30 and 102 at the top and bottom respectively of the metallized portion 29. The front side surface 27 of the narrow section 22 is metallized. There is an unmetallized area each 103 and 101 at the top and bottom respectively of the metallized portion 27. The bottom surfaces of the filter sections and the narrow section connecting them are metallized. These metallic portions are 25, 31 and 28 respectively. There is an unmetallized area 330 on the bottom side of the connecting section 22 of the filter. The input is fed made at 32. A bias voltage source is connected to 31. The inductance L provides a high impedance, at an operating frequency of the band pass filter, to the RF energy. Any remaining RF energy is by passed to the ground by the capacitor C. The top surface 21 is grounded to provide a return circuit to the bias voltage. A variable bias voltage V is applied to the ferroelectric material of the second section of the filter. With the application of a bias voltage V, the permittivity of the ferroelectric material of the second section of the filter changes, changing the resonant frequency of the resonator and the frequency of the signal passing through the band pass filter. A variable bias voltage V2, applied through L2C2 filter, changes the frequency of the first section of the filter.

Between the second and third sections of the filter is connected an unmetallized section of a ferroelectric material, same as the ferroelectric material of the first two sections, 80. The section 80 has a lower height as compared to the first two sections of the filter.

Each resonator is rectangular in shape and is resonant at a $TE_{10}$ mode frequency. The top side 50 of the third section of the filter is a quarter wave, at an operating frequency of the filter, long. The top surface 50 is metallized. The top side 51 of the fourth section of the filter is a quarter wave, at an operating frequency of the filter, long. The top surface 51 is metallized. The two sections of filter 50 and 51 are connected together by a narrow section 52. The top surface of the narrow section 52 is metallized. Below the metallized sections 50, 51 and 52 is a single crystal ferroelectric material, same as that used for the first two sections of the tunable filter, such as $KTa_{1-x}Nb_xO_3$, $Sr_{1-x}Pb_xTiO_3$. The front surface of the third section of the filter is 53 which is not metallized. The front side surface 54 of the third section of the band pass filter is metallized. There is an unmetallized area each 56 and 200 at the top and bottom respectively of the metallized portion 54. The front side surface 59 of the fourth section of the band pass filter is metallized. There is an unmetallized area each 60 and 202 at the top and bottom respectively of the metallized portion 59. The front side surface 57 of the narrow section 52 is metallized. There is an unmetallized area each 203 and 201 at the top and bottom respectively of the metallized portion 57. The bottom surfaces of the filter sections and the narrow section connecting them are metallized. These metallic portions are 55, 58 and 61 respectively. There is an unmetallized area 331 on the bottom side between connecting section 52 and the fourth section of the filter. The third section rear surface central part is metallized. The output is taken from 34. A bias voltage source is connected to 61. The inductance L1 provides a high impedance, at an operating frequency of the band pass filter, to the RF energy. Any remaining RF energy is by passed to the ground by the capacitor C1. The top surface 51 is grounded to provide a return circuit to the bias voltage. A variable bias voltage V1 is applied to the ferroelectric material of the fourth section of the filter. This provides a flexibility of independently tuning the first and second sections, and the third and fourth sections of the filter to take into account of any manufacturing tolerance. With the application of a bias voltage V1, the permittivity of the ferroelectric material of the fourth section of the filter changes, changing the resonant frequency of the fourth resonator and the frequency of the signal passing through the band pass filter. The bias voltages V and V1 are synchronized to make the resonant frequency, of two sections of the filter, identical. A variable bias voltage V3 is applied, through an L3C3 filter, to 55 to change the frequency of the third section of the filter to take care of the manufacturing tolerances. The tunable band pass filter is operated at a constant temperature slightly above the curie temperature of the ferroelectric material.

Figure 10:
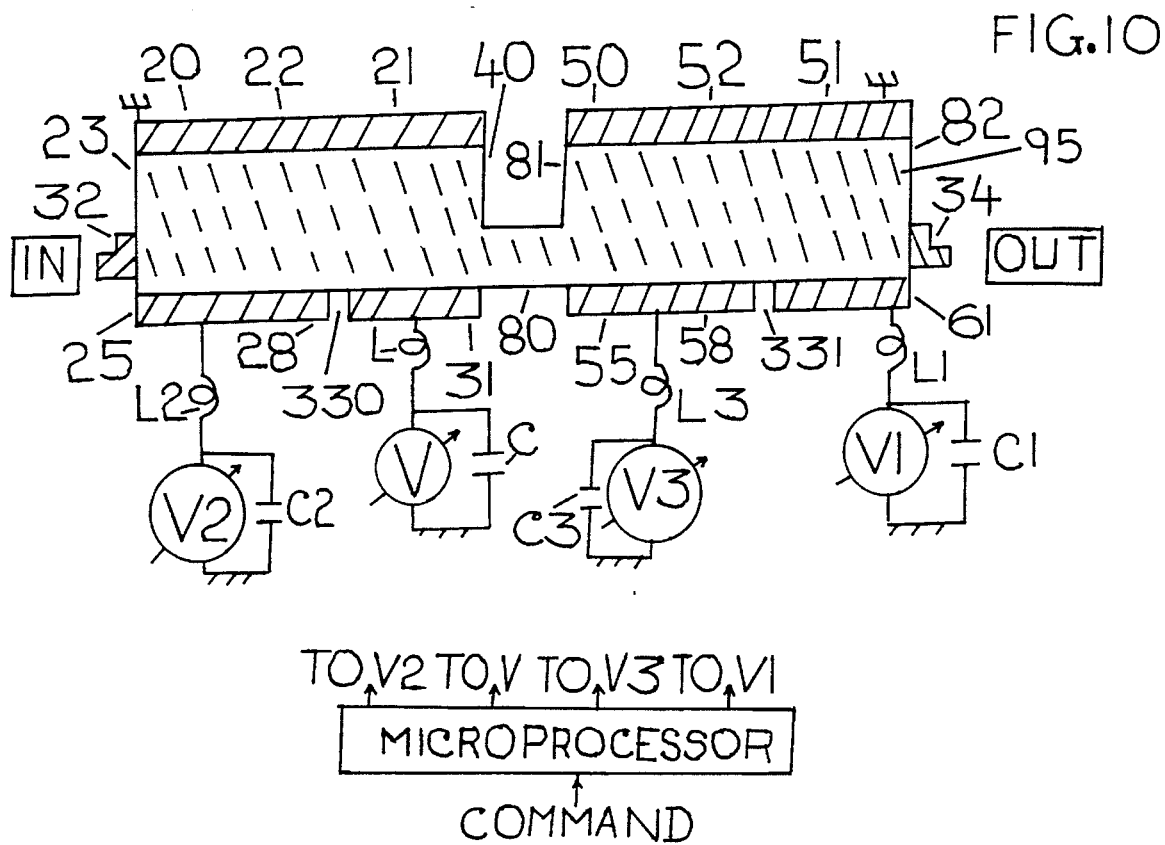
FIG. 10 depicts a longitudinal cross-section through the center of FIG. 9.

FIG. 10 depicts a longitudinal cross-section through the center of FIG. 9. The front surface of the first section is 23. The ferroelectric material, such as $KTa_{1-x}Nb_xO_3$, $Sr_{1-x}Pb_xTiO_3$, is 95. The metallized portion, on top of the first two sections, is 20, 22 and 21. The rear surface the second section is 40. The bottom metallized portion is 25, 28 and 31 with an unmetallized area 330. The front surface of the third section is 81. The ferroelectric material, such as $KTa_{1-x}Nb_xO_3$, $Sr_{1-x}Pb_xTiO_3$, is 95. The metallized portion, on top of the third and fourth sections, is 50, 52 and 51. The rear surface the fourth section is 82. The bottom metallized portion is 55, 58 and 61 with an unmetallized area 331. The two sections, each of two section filter, are connected by a slotted section 80 of a ferroelectric material same as all the sections of the filter. Bias voltages V2, V, V3 and V1 are applied, through the bias filters L2C2, LC, L3C3 and L1C1 respectively, to the first, second, third and fourth sections of the tunable filter respectively. Separate bias voltages are applied to take care of the manufacturing tolerances.

Figure 11:
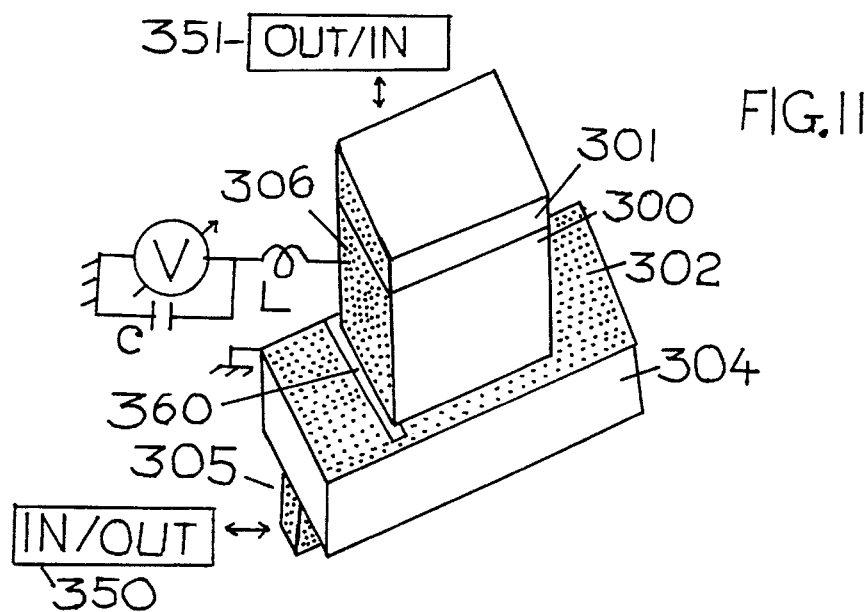
FIG. 11 depicts a pictorial view of a tunable ferroelectric resonator (TFR) antenna.

FIG. 11 depicts a pictorial view of another embodiment of my invention a tunable ferroelectric resonator (TFR) antenna. A single crystal ferroelectric, such as $KTa_{1-x}Nb_xO_3$, $Sr_{1-x}Pb_xTiO_3$, resonator is 300. The left side surface 306 of the ferroelectric tunable resonator (TFR) is metallized. To match the impedance of the resonator to the free space a quarter wave, at an operating frequency of the resonator antenna, long transformer 301 comprised of a ferroelectric material, different from a ferroelectric material of the TFP, is provided. A ground plane, with an unmetallized area 360, is 302. A slot (not visible in this figure) is used for coupling energy to the TFP. A substrate comprised of a single crystal dielectric, such as sapphire, lanthunum aluminate, is 304. The input is fed to the microstrip line 305. A bias voltage V is applied to the TFR through an LC filter. The TFR antenna is analysed using a finite-difference time domain (FDTD) method. The signal is transmitted from or received by 351.

Figure 12:
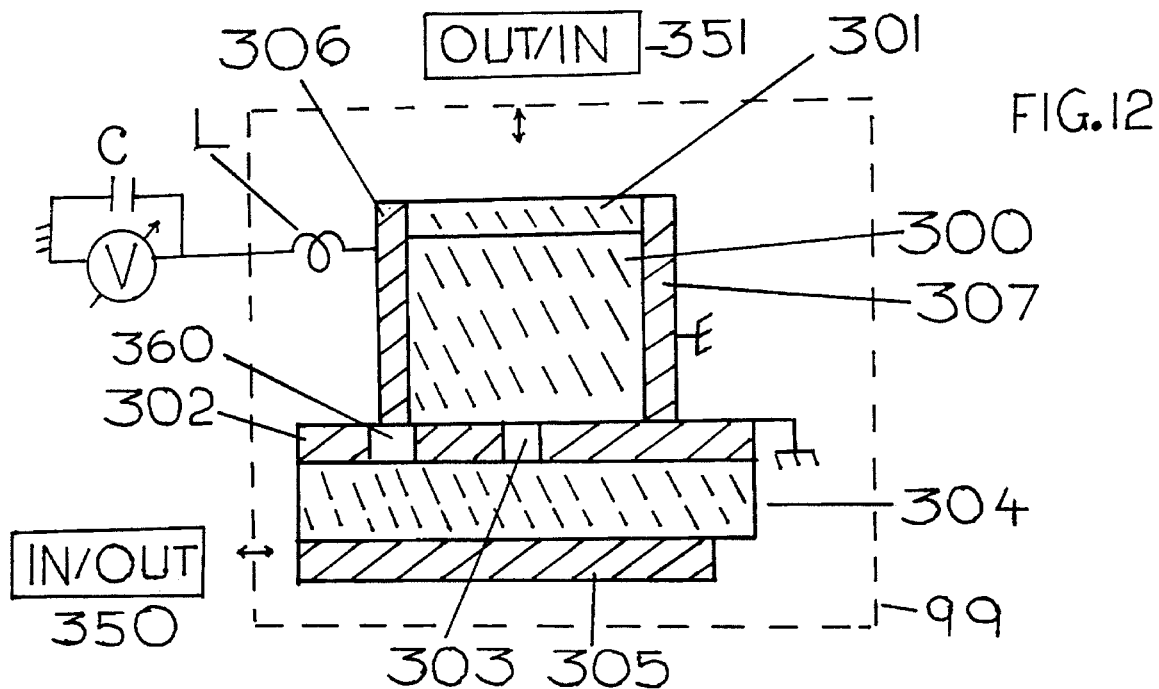
FIG. 12 depicts a longitudinal cross-section of the TFR antenna shown in FIG. 11.

FIG. 12 depicts a longitudinal cross-section of the TFR antenna shown in FIG. 11. The TFR is 300 comprised of a single crystal ferroelectric, such as $KTa_{1-x}Nb_xO_3$, $Sr_{1-x}Pb_xTiO_3$. A quarter wave long, at an operating frequency of the tunable ferroelectric resonator antenna, matching transformer 301, comprised of a single crystal ferroelectric material, different from the material 300 of the TFR antenna, is used to match the impedance of the TFR antenna 300 to the impedance of free space. The left 306 and the right 307 sides of the TFR antenna are deposited with a conducting material. A ground plane 302, with an unmetallized area 360, comprised of a single crystal high Tc superconductor, such as YBCO, TBCCO, is connected to the ground. A slot 303 is used to excite the TFR antenna 300. Return loss of the antenna increases with the slot width. A substrate, comprised of a single crystal dielectric such as sapphire, lanthanum aluminate, is 304. A microstrip line 305 comprised of a film of a single crystal high Tc superconductor, such as YBCO, TBCCO, is deposited on the substrate 304. A bias voltage V is applied, through an LC filter, to the TFR to change its permittivity and as such its resonant frequency. With the application of a bias voltage the permittivity of the TFR 300 changes, the permittivity of the quarter wave transformer 301 also changes simultaneously providing a good match between the TFR antenna 300 and the free space. The TFR antenna is operated at a high Tc superconducting temperature slightly above the Curie temperature of the TFR 300. The commercial means for keeping the TFR antenna 300 at a high Tc superconducting temperature is 99. The signal is radiated from or received by 351.

Figure 13:
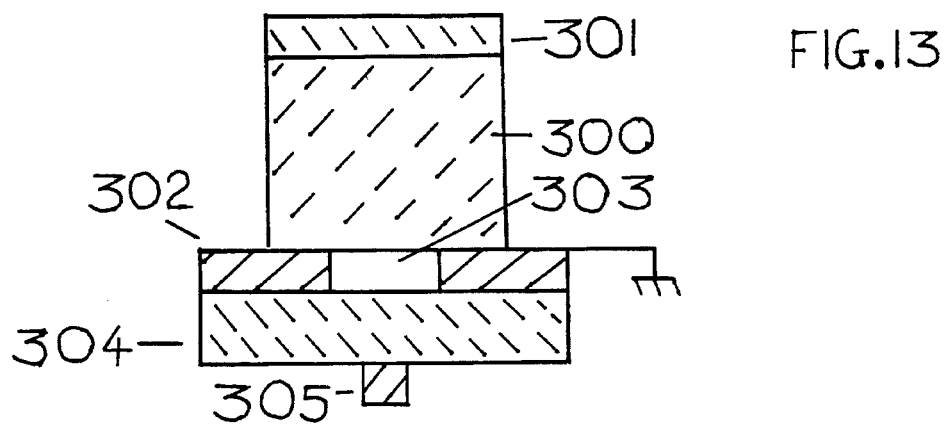
FIG. 13 depicts a transverse cross-section of the TFR antenna shown in FIG. 11.

FIG. 13 depicts a transverse cross-section of the TFR antenna shown in FIG. 11. The TFR is 300. The matching quarter wave transformer is 301. The ground plane, comprised of a film of a single crystal high Tc superconductor is 302. The slot, for coupling energy to the TFR antenna 300, is 303. A single crystal dielectric, such as sapphire or lanthanum aluminate, is 304. A microstrip line 305, comprised of a film of a single crystal high Tc superconductor such as YBCO, TBCCO is deposited on the substrate 304.

Different ferroelectrics, ferroelectric liquid crystals (FLC), dielectrics, impedances, high Tc superconductors, different frequencies, different microstrip lines, different couplings between the TFR and the microstrip line different modes of TFR are contemplated.

FIG. 14 depicts an embodiment of my invention, a pictorial view of a high Tc superconducting tunable ferroelectric oscillator. A single crystal ferroelectric, such as $KTa_{1-x}Nb_xO_3$, $Sr_{1-x}Pb_xTiO_3$, resonator is 413. It is coupled to a main microstrip line 406. The substrate 405 is comprised of a single crystal dielectric such as sapphire, lanthanum aluminate. A negative resistance diode, such as GUNN (GaAs, InP), IMPATT, TRAPATT, is 411. A quarter wave, at a second harmonic of an operating frequency of the tunable oscillator, open circuit microstrip line is 412 which controls the second harmonic loading without affecting the fundamental frequency circuit. The negative resistance diode is connected to a bias voltage source V1 through an L1C1 filter. The inductance L1 provides a high impedance at an operating frequency of the tunable oscillator. The capacitance C1 provides a low impedance to any RF energy remaining after L1. A separation of 90 and 180 degrees between the negative resistance diode and the single crystal ferroelectric resonator controls effective Q, efficiency and stability of the oscillator. A separation of 90 degrees provides temperature stability and 180 degrees provides output power efficiency. A quarter wave, at an operating frequency of the tunable oscillator, microstrip line 409 is coupled to the main microstrip line 406. The 50 ohm microstrip line 410 is connected to and an extension of 409. The output is taken from 404. A quarter wave, at an operating frequency of the tunable oscillator, microstrip line 407 is coupled to the main microstrip line 406. The 50 ohm microstrip line 408 is connected to and an extension of 407. A matched load 402 is connected to 408. The purpose of the input 407 and output 409 quarter wave transformers is to isolate the bias voltage V1 from the input load and the output circuit. The single crystal ferroelectric resonator 413 controls the frequency of the oscillator. A bias voltage V2 is applied, through an L2C2 filter, to the tunable ferroelectric resonator. An application of a bias voltage V2 to the single crystal ferroelectric resonator changes the permittivity of the ferroelectric and, as such, the frequency of the ferroelectric resonator and the frequency of the oscillator. A table is prepared with the frequency of the ferroelectric resonator 413 versus the applied bias voltage V2. This table is stored in the memory of a microprocessor 420 which, on command, controls the frequency of the oscillator. A table is also prepared with the frequency of the oscillator versus the bias voltage V1 to give the optimum performance of the oscillator. This second table is also stored in the memory of a microprocessor 420 which, on command, controls the optimum output of the oscillator. All microstrip lines are comprised of films of a single crystal high Tc superconductor such as YBCO, TBCCO.

Figure 15:
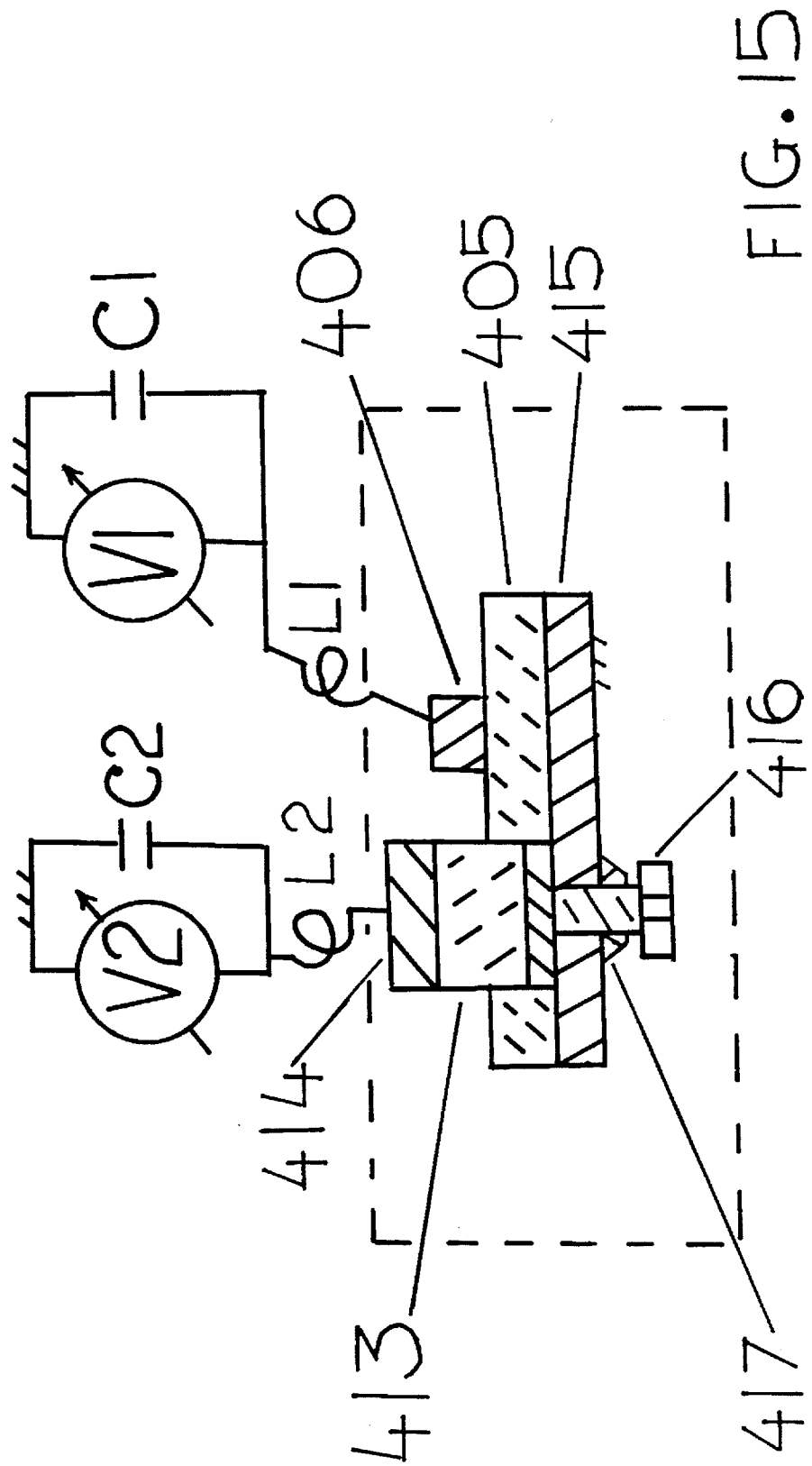
FIG. 15 depicts a transverse cross-section of the TFR shown in FIG. 14.

FIG. 15 depicts a transverse cross-section, through the ferroelectric resonator and the main microstrip line, of my invention a tunable ferroelectric oscillator shown in FIG. 14. A cross-section of the main microstrip line is 406. A cross-section of the single crystal ferroelectric resonator is 413. A conductive deposition on top of the ferroelectric resonator 413 is 414. A screw 416 and a nut 417 are provided to slide the ferroelectric resonator, if necessary, to take into account the fabrication variances of the circuit and the negative resistance diode 411. Once the design is verified by experiments, the screw and the nut may be discarded for manufacturing simplicity. Any small variation, in manufacturing or in the negative resistance diode, can be compensated by the bias voltages V2 and V1. A bias voltage V1 is applied to the main microstrip line through an L1C1 filter to set the negative resistance diode at its optimum operating point. A bias voltage V2 is applied to the ferroelectric resonator 13 through an L2C2 filter to permit a change in the permittivity of the ferroelectric resonator and the frequency of the oscillator. On the bottom of the substrate 405 is a film or a material of a single crystal high Tc superconductor 415.

All my embodiments are operated at a high superconducting temperature. All high Tc superconductors such as YBCO, TBCCO, single crystal dielectrics are contemplated in this invention.

Figure 16:
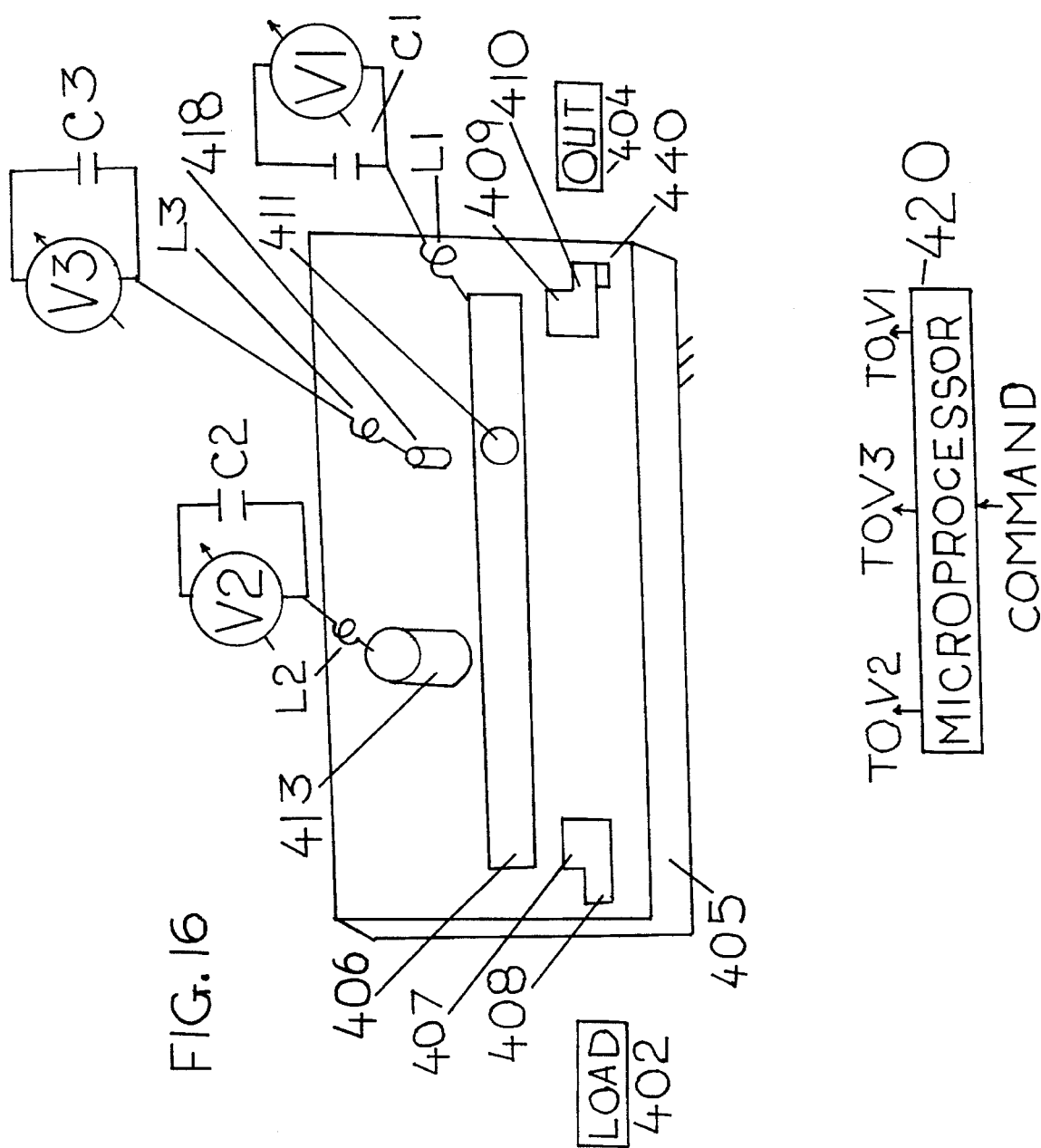
FIG. 16 depicts a pictorial view of a high Tc superconducting tunable ferroelectric resonator (TFR) second oscillator.

FIG. 16 depicts an embodiment of my invention, a pictorial diagram of a high Tc superconducting tunable ferroelectric oscillator (TFO). A single crystal ferroelectric, such as $KTa_{1-x}Nb_xO_3$, $Sr_{1-x}Pb_xTiO_3$, resonator is 413. It is coupled to a main microstrip line 406. The substrate 405 is comprised of a single crystal dielectric such as sapphire, lanthanum aluminate. A negative resistance diode, such as GUNN (GaAs, InP), IMPATT, TRAPATT, is 411. A single crystal ferroelectric resonator, tuned to a second harmonic of the operating frequency of the tunable oscillator, is 418 which controls the second harmonic loading without affecting the fundamental frequency circuit. The negative resistance diode is connected to a bias voltage source V1 through an L1C1 filter. The inductance L1 provides a high impedance at an operating frequency of the tunable oscillator. The capacitance C1 provides a low impedance to any RF energy remaining after L1. A separation of 90 and 180 degrees between the negative resistance diode and the single crystal ferroelectric resonator controls effective Q, efficiency and stability of the oscillator. A separation of 90 degrees provides temperature stability and 180 degrees provides output power efficiency. A quarter wave, at an operating frequency of the tunable oscillator, microstrip line 409 is coupled to the main microstrip line 406. The 50 ohm microstrip line 410 is connected to and an extension of 409. The output is taken from 404. A quarter wave, at an operating frequency of the tunable oscillator, microstrip line 407 is coupled to the main microstrip line 406. The 50 ohm microstrip line 408 is connected to and an extension of 407. A matched load 402 is connected to 408. The purpose of the input 407 and output 409 quarter wave transformers is to isolate the bias voltage V1 from the input load and the output circuit. The single crystal ferroelectric resonator 413 controls the frequency of the oscillator. A bias voltage V2 is applied, through an L2C2 filter, to the tunable ferroelectric resonator. An application of a bias voltage V2 to the single crystal ferroelectric resonator changes the permittivity of the ferroelectric and, as such, the frequency of the ferroelectric resonator and the frequency of the oscillator. A table is prepared with the frequency of the ferroelectric resonator 13 versus the applied bias voltage V2. This table is stored in the memory of a microprocessor 420 which, on command, controls the frequency of the oscillator. A table is also prepared with the frequency of the oscillator versus the bias voltage V1 to give the optimum performance of the oscillator. This second table is also stored in the memory of a microprocessor 420 which, on command, controls the optimum output of the oscillator. All microstrip lines are comprised of films of a single crystal high Tc superconductor such as YBCO, TBCCO. The same label numbers refer to the same part of the TFO. There are two differences between FIG. 14 and FIG. 16. In FIG. 16, there is no quarter wave transformer 412. Instead a single crystal ferroelectric resonator, tuned to a second harmonic frequency of an operating frequency of the oscillator, is used.

Figure 17:
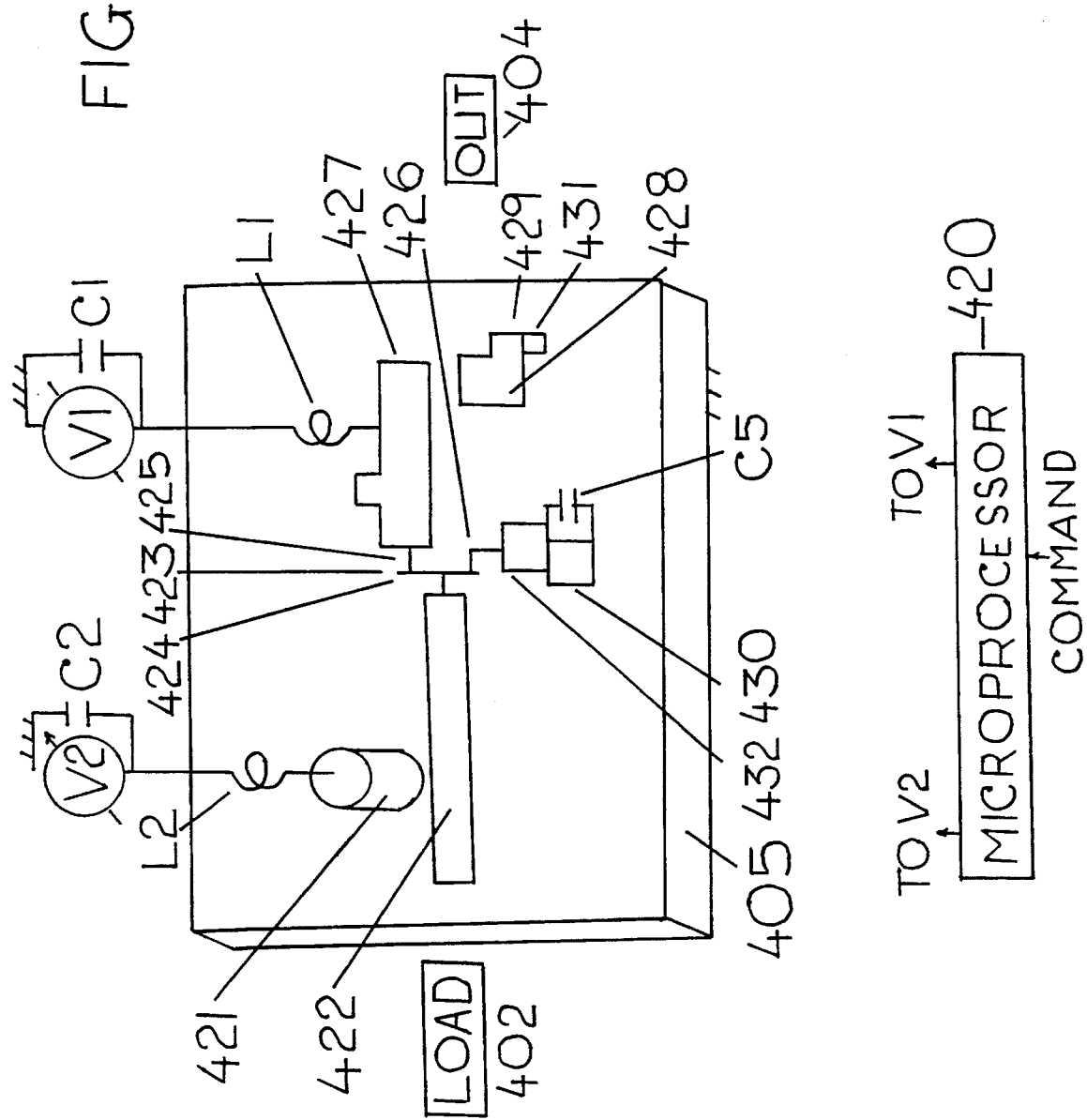
FIG. 17 depicts a transverse cross-section of the TFR shown in FIG. 16.

FIG. 17 depicts another embodiment of my invention, a high Tc superconducting tunable ferroelectric oscillator (TFO). A transistor is 423. It can be a npn or pnp bipolar transistor, a field effect transistor (FET), or a high electron mobility transistor (HEMT). The gate is 424 and is connected to a transmission line 422. A single crystal ferroelectric tunable resonator 421 is coupled to the microstrip line 422. The drain is 425 and is connected to a microstrip line 427 matching network. A feedback loop is connected to the source 426 and is comprised of a stub connected to parallel combination of a resistor 430 and a capacitor C5. A bias voltage V1 to the drain is supplied through a filter L1C1. The inductance L1 provides a high impedance at an operating frequency of the oscillator. The capacitance C1 by passes any RF energy present after the inductance L1. A bias voltage V2 is connected to the single crystal ferroelectric resonator 421 through an L2C2 filter. The ferroelectric resonator 421 is tuned to an operating frequency of the oscillator. On the application of a bias voltage to the ferroelectric resonator 421, the permittivity of the ferroelectric resonator changes, and, as a result, the frequency of the ferroelectric resonator changes, changing the frequency of the oscillator. A quarter wave, at an operating frequency of the oscillator, microstrip line is 428 and is coupled to the transmission line 427. A 50 ohm microstrip line 429 is connected to and is an extension of the microstrip line 428. A 50 ohm load is connected to 429. The purpose of the quarter wave coupled line 428 is to isolate the bias voltage V1 from the output load and circuit. The output is 404. A 50 ohm load 402 can be used to terminate the microstrip line 422 with the ground. Otherwise a built in resistor can be used. A single crystal dielectric, such as sapphire or lanthanum aluminate, is the substrate 405. All microstrip lines are comprised of films of a single crystal high Tc superconductor such as YBCO, TBCCO. A table is prepared with the frequency of the ferroelectric resonator 421 versus the applied bias voltage V2. This table is stored in the memory of a microprocessor 420 which, on command, controls the frequency of the oscillator. A table is also prepared with the frequency of the oscillator versus the bias voltage V1 to give the optimum performance of the oscillator. This second table is also stored in the memory of a microprocessor 420 which, on command, controls the optimum output of the oscillator.

Figure 18:
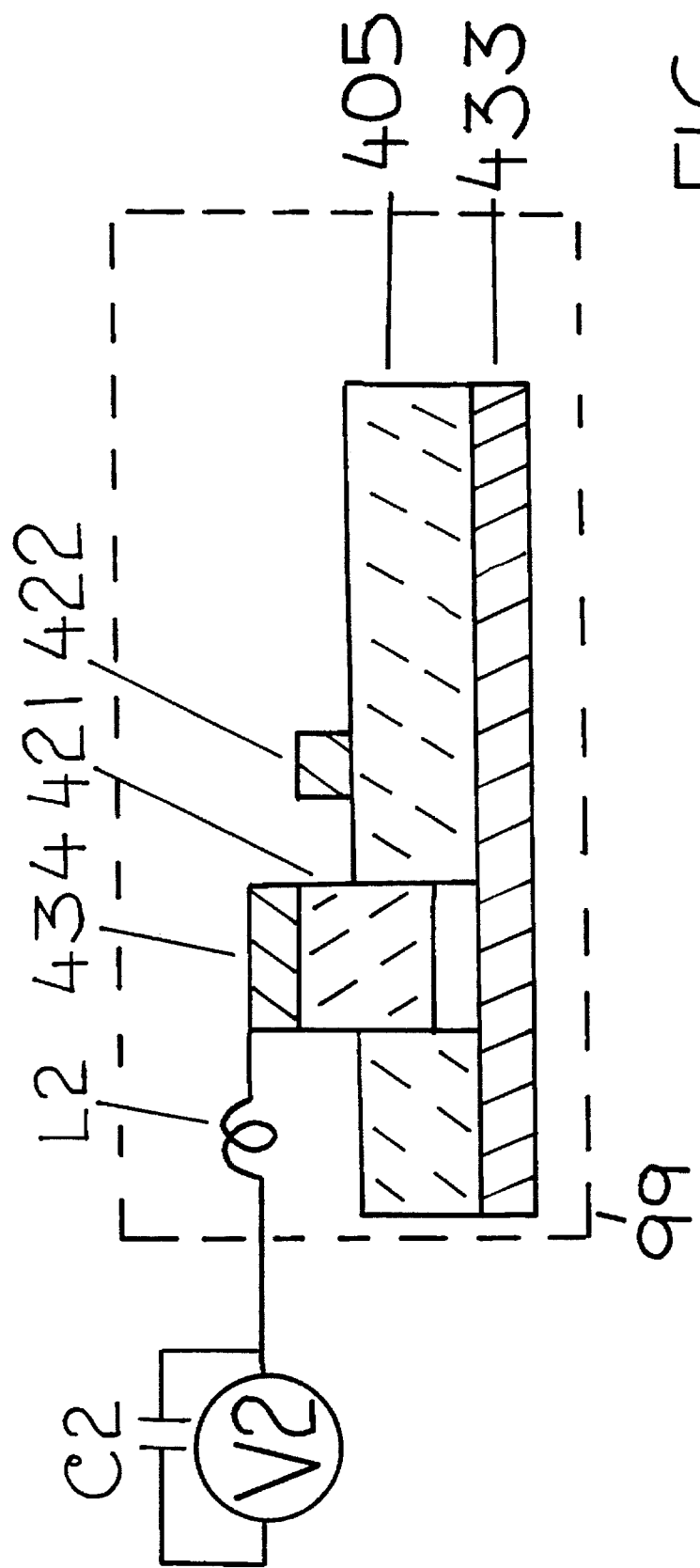
FIG. 18 depicts a pictorial view of a high Tc superconducting tunable ferroelectric resonator (TFR) third oscillator.

FIG. 18 depicts another embodiment of my invention and is a transverse cross-section of FIG. 17 through the ferroelectric resonator 421 and the microstrip line 422 of FIG. 17. A single crystal dielectric material is 405. A single crystal high Tc superconductor ground plane is 433. A conducting deposition, on top of the ferroelectric resonator 421, is 434. A bias voltage V2 is connected to 434. An inductance L2 provides a high impedance at an operating frequency of the tunable oscillator. A capacitance C2 provides a short circuit to any RF energy present after the inductance L2.

Figure 19:
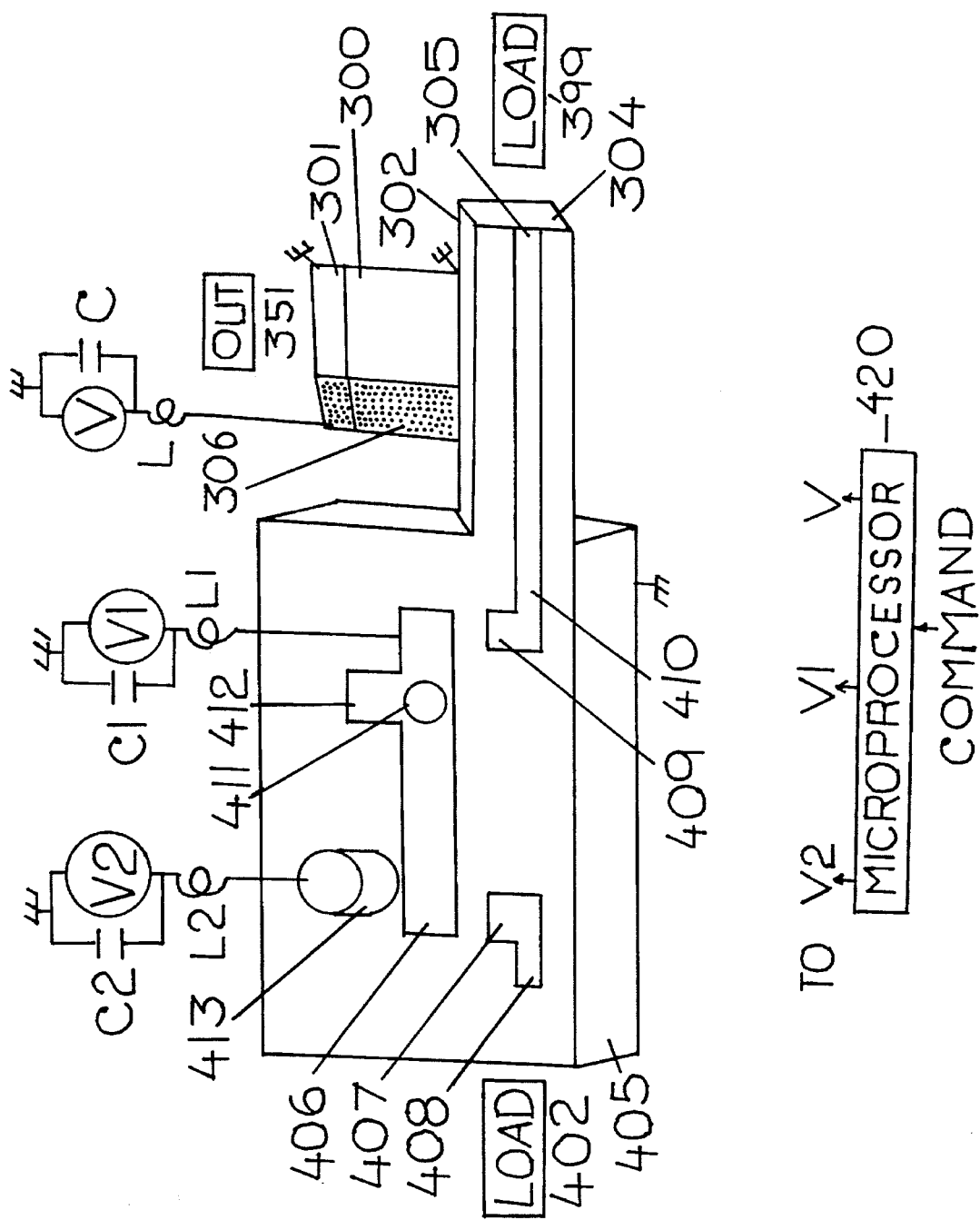
FIG. 19 depicts a pictorial view of a high Tc superconducting tunable ferroelectric resonator first transmitting system.

FIG. 19 depicts an embodiment of my invention, a pictorial view of a high Tc superconducting tunable ferroelectric transmitting system containing an oscillator and an antenna. A single crystal ferroelectric, such as $KTa_{1-x}Nb_xO_3$, $Sr_{1-x}Pb_xTiO_3$, resonator is 413. It is coupled to a main microstrip line 406. The substrate 405 is comprised of a single crystal dielectric such as sapphire, lanthanum aluminate. A negative resistance diode, such as GUNN (GaAs, InP), IMPATT, TRAPATT, is 411. A quarter wave, at a second harmonic of an operating frequency of the tunable oscillator, open circuit microstrip line is 412 which controls the second harmonic loading without affecting the fundamental frequency circuit. The negative resistance diode is connected to a bias voltage source V1 through an L1C1 filter. The inductance L1 provides a high impedance at an operating frequency of the tunable oscillator. The capacitance C1 provides a low impedance to any RF energy remaining after L1. A separation of 90 and 180 degrees between the negative resistance diode and the single crystal ferroelectric resonator controls effective Q, efficiency and stability of the oscillator. A separation of 90 degrees provides temperature stability and 180 degrees provides output power efficiency. A quarter wave, at an operating frequency of the tunable oscillator, microstrip line 409 is coupled to the main microstrip line 406. The 50 ohm microstrip line 410 is connected to and an extension of 409. The output is fed to antenna input 505. A quarter wave, at an operating frequency of the tunable oscillator, microstrip line 407 is coupled to the main microstrip line 406. The 50 ohm microstrip line 408 is connected to and an extension of 407. A matched load 402 is connected to 408. The purpose of the input 406 and output 409 quarter wave transformers is to isolate the bias voltage V1 from the input load and the output circuit. The single crystal ferroelectric resonator 413 controls the frequency of the oscillator. A bias voltage V2 is applied, through an L2C2 filter, to the tunable ferroelectric resonator. An application of a bias voltage V2 to the single crystal ferroelectric resonator changes the permittivity of the ferroelectric and, as such, the frequency of the ferroelectric resonator and the frequency of the oscillator. A table is prepared with the frequency of the ferroelectric resonator 413 versus the applied bias voltage V2. This table is stored in the memory of a microprocessor 420 which, on command, controls the frequency of the oscillator. A table is also prepared with the frequency of the oscillator versus the bias voltage V1 to give the optimum performance of the oscillator. This second table is also stored in the memory of a microprocessor 420 which, on command, controls the optimum output of the oscillator. All microstrip lines are comprised of films of a single crystal high Tc superconductor such as YBCO, TBCCO.

A single crystal ferroelectric, such as $KTa_{1-x}Nb_xO_3$, $Sr_{1-x}Pb_xTiO_3$, tunable resonator is 300. The left side surface 306 of the ferroelectric tunable resonator (TFR) is metallized. To match the impedance of the resonator to the free space a quarter wave, at an operating frequency of the resonator antenna, long transformer 301 comprised of a ferroelectric material, different from a ferroelectric material of the TFR, is provided. A ground plane is 302. A slot (shown in FIG. 12 and not visible in this figure) is used for coupling energy to the TFR. A substrate comprised of a single crystal dielectric, such as sapphire, lanthunum aluminate, is 304. The input from the oscillator is fed to the microstrip line 305. A bias voltage V is applied to the TFR through an LC filter to change the tuned frequency of the resonator antenna. The TFR antenna is analysed using a finite-difference time domain (FDTD) method. The transmitted signal is shown by 351. A microprocessor 420 synchronizes all the bias voltages for proper operation of the tunable transmitting system.

Figure 20:
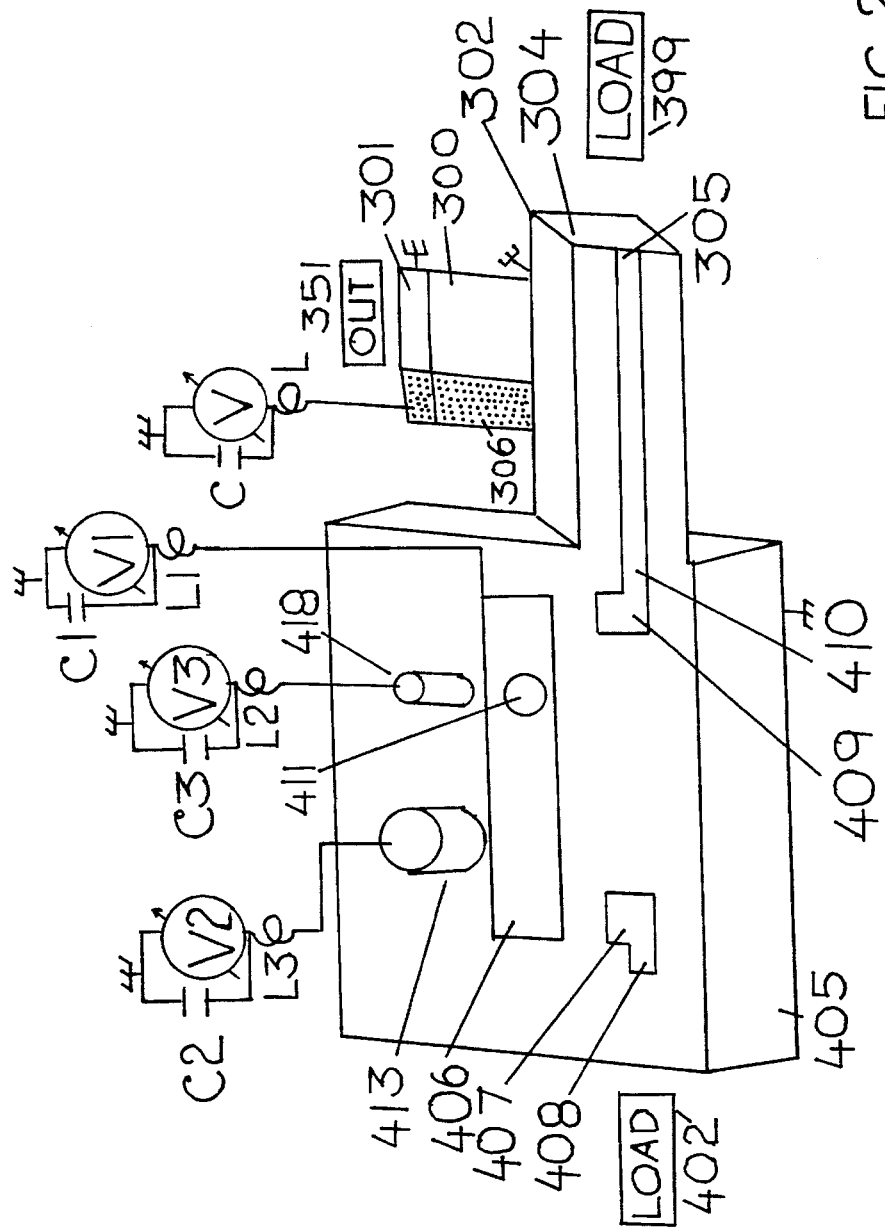
FIG. 20 depicts a pictorial view of a high Tc superconducting tunable ferroelectric resonator second transmitting system.

FIG. 20 depicts an embodiment of my invention, a pictorial view of high Tc superconducting tunable ferroelectric second transmitting system containing an oscillator and an antenna. A single crystal ferroelectric, such as $KTa_{1-x}Nb_xO_3$, $Sr_{1-x}Pb_xTiO_3$, resonator is 413. It is coupled to a main microstrip line 406. The substrate 405 is comprised of a single crystal dielectric such as sapphire, lanthanum aluminate. A single crystal ferroelectric resonator, tuned to a second harmonic of the operating frequency of the tunable oscillator is 418 which controls the second harmonic loading without affecting the fundamental frequency circuit. The negative resistance diode is connected to a bias voltage source V1 through an L1C1 filter. The inductance L1 provides a high impedance at an operating frequency of the tunable oscillator. The capacitance C1 provides a low impedance to any RF energy remaining after L1. A separation of 90 and 180 degrees between the negative resistance diode and the single crystal ferroelectric resonator controls effective Q, efficiency and stability of the oscillator. A separation of 90 degrees provides temperature stability and 180 degrees provides output power efficiency. A quarter wave, at an operating frequency of the tunable oscillator, microstrip line 409 is coupled to the main microstrip line 406. The 50 ohm microstrip line 410 is connected to and an extension of 409. The output is fed to the antenna input 305. A quarter wave, at an operating frequency of the tunable oscillator, microstrip line 407 is coupled to the main microstrip line 406. The 50 ohm microstrip line 408 is connected to and an extension of 407. A matched load 402 is connected to 408. The purpose of the input 406 and output 409 quarter wave transformers is to isolate the bias voltage V1 from the input load and the output circuit. The single crystal ferroelectric resonator 413 controls the frequency of the oscillator. A bias voltage V2 is applied, through an L2C2 filter, to the tunable ferroelectric resonator. An application of a bias voltage V2 to the single crystal ferroelectric resonator changes the permittivity of the ferroelectric and, as such, the frequency of the ferroelectric resonator and the frequency of the oscillator. A table is prepared with the frequency of the ferroelectric resonator 413 versus the applied bias voltage V2. This table is stored in the memory of a microprocessor 420 which, on command, controls the frequency of the oscillator. A table is also prepared with the frequency of the oscillator versus the bias voltage V1 to give the optimum performance of the oscillator. This second table is also stored in the memory of a microprocessor 420 which, on command, controls the optimum output of the oscillator. All microstrip lines are comprised of films of a single crystal high Tc superconductor such as YBCO, TBCCO.

A single crystal ferroelectric, such as $KTa_{1-x}Nb_xO_3$, $Sr_{1-x}Pb_xTiO_3$, resonator is 300. The left side surface 306 of the ferroelectric tunable resonator (TFR) is metallized. To match the impedance of the resonator to the free space a quarter wave, at an operating frequency of the resonator antenna, long transformer 301 comprised of a ferroelectric material, different from a ferroelectric material of the TFR, is provided. A ground plane is 302. A slot (shown in FIG. 12 and not visible in this figure) is used for coupling energy to the TFR. A substrate comprised of a single crystal dielectric, such as sapphire, lanthunum aluminate, is 304. The input from the oscillator is fed to the microstrip line 305. A bias voltage V is applied to the TFR through an LC filter to change the tuned frequency of the antenna. The TFR antenna is analysed using a finite-difference time domain (FDTD) method. The transmitted signal is shown by 351. A microprocessor 420 synchronizes all the bias voltages for proper operation of the tunable transmitting system.

FIG. 21 depicts another embodiment of my invention, a high Tc superconducting tunable ferroelectric third transmitting system containing an oscillator and an antenna. A transistor is 423. It can be a npn or pnp bipolar transistor, a field effect transistor (FET), or a high electron mobility transistor (HEMT). The gate is 424 and is connected to a transmission line 422. A single crystal ferroelectric tunable resonator 421 is coupled to the microstrip line 422. The drain is 425 and is connected to a microstrip line 427 matching network. A feedback loop is connected to the source 426 and is comprised of a stub connected to parallel combination of a resistor 430 and a capacitor C5. A bias voltage V1 to the drain is supplied through a filter L1C1. The inductance L1 provides a high impedance at an operating frequency of the oscillator. The capacitance C1 by passes any RF energy present after the inductance L1. A bias voltage V2 is connected to the single crystal ferroelectric resonator 421 through an L2C2 filter. The ferroelectric resonator 421 is tuned to an operating frequency of the oscillator. On the application of a bias voltage to the ferroelectric resonator 421, the permittivity of the ferroelectric resonator changes, and, as a result, the frequency of the ferroelectric resonator changes, changing the frequency of the oscillator. A quarter wave, at an operating frequency of the oscillator, microstrip line is 428 and is coupled to the transmission line 427. A 50 ohm microstrip line 429 is connected to and is an extension of the microstrip line 428. The purpose of the quarter wave coupled line 428 is to isolate the bias voltage V1 from the output load and circuit. The output is 429. A 50 ohm load 402 can be used to terminate the microstrip line 422 with the ground. Otherwise a built in resistor can be used. A single crystal dielectric, such as sapphire or lanthanum aluminate, is the substrate 405. All microstrip lines are comprised of films of a single crystal high Tc superconductor such as YBCO, TBCCO. A table is prepared with the frequency of the ferroelectric resonator 421 versus the applied bias voltage V2. This table is stored in the memory of a microprocessor 20 which, on command, controls the frequency of the oscillator. A table is also prepared with the frequency of the oscillator versus the bias voltage V1 to give the optimum performance of the oscillator. This second table is also stored in the memory of a microprocessor 420 which, on command, controls the optimum output of the oscillator.

A single crystal ferroelectric, such as $KTa_{1-x}Nb_xO_3$, $Sr_{1-x}Pb_xTiO_3$, tunable resonator is 300. To match the impedance of the resonator to the free space a quarter wave, at an operating frequency of the resonator antenna, long transformer 301 comprised of a ferroelectric material, different from a ferroelectric material of the TFR, is provided. A ground plane is 302. A slot (shown in FIG. 12 and not visible in this figure) is used for coupling energy to the TFR. A substrate comprised of a single crystal dielectric, such as sapphire, lanthunum aluminate, is 304. The input from the oscillator is fed to the microstrip line 305. A bias voltage V is applied to the TFR through an LC filter to change the tuned frequency of the antenna. The TFR antenna is analysed using a finite-difference time domain (FDTD) method. The transmitted signal is shown by 351. A microprocessor 420 synchronizes all the bias voltages for proper operation of the tunable transmitting system.

All embodiments of my invention are operated at a high superconducting temperature slightly above the Curie temperature of the single crystal ferroelectric resonator. All single crystal ferroelectric materials, single crystal dielectric materials, compositions of single crystal ferroelectrics and polythene, frequencies, impedances of microstrip lines, high Tc superconductors including YBCO and TBCCO, are contemplated in this invention. All my embodiments can be comprised of normal, room temperature conductors and can be operated at a room temperature.

What is claimed is:

1. A high Tc superconducting tunable ferroelectric transmitting system containing an oscillator and a tunable antenna, ferroelectric resonator whose permittivity is a function of a bias field applied across it and a tuning frequency, a Curie temperature, dielectric material, input, output, and an operating frequency and comprising:

a tunable ferroelectric resonator (TFR) oscillator comprising:
a single crystal dielectric substrate;
a main first microstrip line on said single crystal dielectric substrate;
a negative resistance diode being connected across one end of said main first microstrip line;
a quarter wavelength long, at a second harmonic of an operating frequency of the tunable transmitting system, open circuit second microstrip line being connected at said negative resistance diode end of said main first microstrip line to provide a short circuit at even harmonics of an operating frequency of said tunable transmitting system;
a single crystal tunable ferroelectric first resonator, having said permittivity, being coupled to said main first microstrip line having an appropriate separation between the negative resistance diode and said single crystal tunable ferroelectric resonator;

said main first microstrip line being coupled to two quadrature coupled filters one at the input and one at the output end of the tunable oscillator and comprising:
a quarter wavelength long, at an operating frequency of the transmitting system, third microstrip line being coupled to and separate from said main first microstrip transmission line at its input;
a 50 ohm fourth microstrip line being connected to and being not a part of said quarter wavelength long third microstrip line;
said fourth microstrip line being terminated, at the input end, in a matched load;
a quarter wavelength long, at an operating frequency of the transmitting system, fifth microstrip line being coupled to and separate from said main first microstrip transmission line at its output;

a 50 ohm sixth microstrip line being connected to and being not a part of said quarter wavelength long fifth microstrip line;
means for applying a bias voltage to said single crystal ferroelectric first resonator for changing its resonant frequency;
means for applying a bias voltage to said diode for obtaining a negative resistance characteristics;

a tunable ferroelectric resonator (TFR) antenna comprising:
a seventh microstrip line being connected to and being an extension of said sixth microstrip line;
a conducting film deposited on the reverse side of said single crystal dielectric substrate;
a single crystal tunable ferroelectric second resonator antenna, having said permittivity, being located on top of said conducting film on said reverse side of said single crystal dielectric substrate;
a hole, below said second resonator antenna, in the conducting film deposition on said reverse side of said single crystal dielectric substrate for coupling energy from said seventh microstrip line to said single crystal tunable ferroelectric second resonator antenna;
said conducting film on said reverse side of said single crystal dielectric substrate being grounded;
said seventh microstrip line being terminated, at the output end, in a matched load;
means for applying a bias voltage to said single crystal tunable ferroelectric second resonator antenna for changing its resonant frequency;
said microstrip lines being comprised of films of a single crystal high Tc superconductor;
all bias voltages being synchronized by a microprocessor for proper operation of said tunable transmitting system;
said tunable transmitting system having a very high quality factor (Q) and having a power handling capability of 0.5 MW;

means for keeping the ferroelectric transmitting system at a high Tc superconducting temperature slightly above said Curie temperature to avoid hysterisis and to obtain a maximum change of permittivity.

\* \* \* \* \*